United States Patent
Pu et al.

(10) Patent No.: US 12,095,049 B2
(45) Date of Patent: Sep. 17, 2024

(54) THERMAL RUNAWAY TRIGGER METHOD

(71) Applicant: CONTEMPORARY AMPEREX TECHNOLOGY CO., LIMITED, Ningde (CN)

(72) Inventors: Yujie Pu, Ningde (CN); Yao Li, Ningde (CN); Yufeng Zhang, Ningde (CN); Jianhuang Ke, Ningde (CN); Xiaobo Chen, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 18/452,578

(22) Filed: Aug. 21, 2023

(65) Prior Publication Data

US 2023/0395881 A1 Dec. 7, 2023

Related U.S. Application Data

(63) Continuation of application No. PCT/CN2022/080645, filed on Mar. 14, 2022.

(30) Foreign Application Priority Data

Nov. 29, 2021 (CN) .......................... 202111436998.6

(51) Int. Cl.
*H01M 10/42* (2006.01)
*G01N 25/20* (2006.01)
(Continued)

(52) U.S. Cl.
CPC ........ *H01M 10/4285* (2013.01); *G01N 25/20* (2013.01); *G01R 31/385* (2019.01);
(Continued)

(58) Field of Classification Search
CPC ................................................. H01M 10/4285
See application file for complete search history.

(56) References Cited

U.S. PATENT DOCUMENTS

| | | | | |
|---|---|---|---|---|
| 5,021,305 A | * | 6/1991 | Turner | ................. H01R 11/284 439/522 |
| 5,244,756 A | | 9/1993 | Mix et al. | |

(Continued)

FOREIGN PATENT DOCUMENTS

| | | |
|---|---|---|
| CN | 205406677 U | 7/2016 |
| CN | 206059574 U | 3/2017 |

(Continued)

OTHER PUBLICATIONS

International Search Report received in the corresponding International Application PCT/CN2022/080645, mailed Aug. 26, 2022.

(Continued)

*Primary Examiner* — Farhana A Hoque
*Assistant Examiner* — Joseph O Nyamogo
(74) *Attorney, Agent, or Firm* — Kilpatrick Townsend & Stockton LLP (57) ABSTRACT

A thermal runaway trigger method relates to the technical field of batteries. The thermal runaway trigger method includes: providing a battery cell and a heating member arranged in the battery cell; and heating the inside of the battery cell by the heating member, so as to cause a thermal runaway of the battery cell. The heating member is arranged inside the battery cell, and the heating member heats the inside of the battery cell to cause the thermal runaway of the battery cell, so that the inside of the battery cell can be heated to cause the thermal runaway of the battery cell in a relatively short time. Due to the reduced internal space of the battery cell, the range of diffusion of the heating member (Continued)

inside the battery cell is small, and the heat loss of the heating member is relatively small.

15 Claims, 9 Drawing Sheets

(51) Int. Cl.
    *G01R 31/28*     (2006.01)
    *G01R 31/385*     (2019.01)
    *H01M 10/052*     (2010.01)
    *H01M 10/615*     (2014.01)
    *H01M 50/581*     (2021.01)

(52) U.S. Cl.
    CPC ..... *H01M 10/052* (2013.01); *H01M 10/4235* (2013.01); *H01M 10/615* (2015.04); *H01M 50/581* (2021.01); *G01R 31/2848* (2013.01); *G01R 31/2849* (2013.01); *H01M 2200/10* (2013.01); *Y02E 60/10* (2013.01)

(56) References Cited

U.S. PATENT DOCUMENTS

| | | | |
|---|---|---|---|
| 2002/0132519 A1* | 9/2002 | Ziegler | H01R 11/282 439/504 |
| 2012/0052351 A1* | 3/2012 | Yeh | H01M 10/052 429/94 |
| 2020/0036068 A1 | 1/2020 | Recoskie et al. | |
| 2021/0391601 A1* | 12/2021 | Doak | H01M 10/654 |

FOREIGN PATENT DOCUMENTS

| | | |
|---|---|---|
| CN | 108376812 A | 8/2018 |
| CN | 110192104 A | 8/2019 |
| CN | 209387836 U | 9/2019 |
| CN | 209641791 U | 11/2019 |
| CN | 110780211 A | 2/2020 |
| CN | 110957545 A | 4/2020 |
| CN | 111239632 A | 6/2020 |
| CN | 111913115 A | 11/2020 |
| CN | 112198437 A | 1/2021 |
| CN | 112382807 A | 2/2021 |
| JP | 2000100449 A | 4/2000 |
| JP | 2020510954 A | 7/2018 |
| KR | 20210029468 A | 3/2021 |

OTHER PUBLICATIONS

Written Opinion received in the corresponding International Application PCT/CN2022/080645, mailed Aug. 26, 2022.
First office action received in the corresponding Chinese Application 202111436998.6, mailed Apr. 28, 2023.
The extended European search report received in the corresponding European Application 22871111.5, mailed Mar. 1, 2024.
Notice of Reasons for Refusal received in the counterpart Japanese application 2023-529095, mailed on Jun. 3, 2024.

* cited by examiner

THERMAL RUNAWAY TRIGGER METHOD

CROSS-REFERENCE TO RELATED APPLICATION

The present application is a continuation of International Application PCT/CN2022/080645, filed Mar. 14, 2022, which claims priority to Chinese Patent Application No. 202111436998.6 entitled "THERMAL RUNAWAY TRIGGER METHOD" and filed on Nov. 29, 2021, which are incorporated herein by reference in their entireties.

TECHNICAL FIELD

The present application relates to the technical field of batteries, and in particular to a thermal runaway trigger method.

BACKGROUND

As an energy storage device, batteries have been widely used in many fields such as electronic products, electric vehicles, and energy storage power stations. Whether the safety of batteries meets the needs of use is a topic of extensive research at present. The thermal runaway of batteries is one of the safety problems of the batteries. When a battery is subjected to a thermal runaway, the temperature inside the battery rises, which eventually leads to a chain reaction of thermal runaway, causing the battery to catch fire and explode. Moreover, the process of thermal runaway will cause thermal runaway to propagation. Thermal runaway and thermal runaway propagation accidents are very likely to cause casualties and property losses.

At present, the safety problem of the battery is mainly analyzed by triggering thermal runaway of a battery cell and observing the propagation of heat in a battery module. However, the traditional way of triggering thermal runaway is difficult to simulate the actual process of thermal runaway.

SUMMARY OF THE INVENTION

Embodiments of the present application provide a thermal runaway trigger method, which makes a simulated thermal runaway process of a battery closer to the actual thermal runaway process of the battery.

An embodiment of the present application provides a thermal runaway trigger method, including:
  providing a battery cell and a heating member arranged in the battery cell; and
  heating the inside of the battery cell by the heating member, so as to cause a thermal runaway of the battery cell.

In the above technical solution, the heating member is arranged inside the battery cell, and the heating member heats the inside of the battery cell to cause the thermal runaway of the battery cell, so that the inside of the battery cell can be heated to cause the thermal runaway of the battery cell in a relatively short time. The heating member is arranged inside the battery cell. Due to the reduced internal space of the battery cell, the range of diffusion of the heating member inside the battery cell is small, and the heat loss of the heating member is relatively small, so that the introduction of a relatively small amount of external energy can trigger the thermal runaway of the battery cell. The heating member heats the inside of the battery cell without destroying the structure of the battery cell, the airtightness of the battery cell to be tested is ensured, and the behavior of the battery cell can be simulated closer to the real thermal runaway, facilitating the determination of a scheme to reduce the thermal runaway of the battery cell and a scheme to reduce the loss during the thermal runaway of the battery cell according to the simulated thermal runaway process.

In some embodiments of the present application, the heating of the inside of the battery cell by the heating member includes:
  heating a separator of an electrode assembly of the battery cell by the heating member to melt the separator, so as to cause a short-circuit inside the battery cell.

In the above technical solution, the short-circuit inside the battery cell is caused by melting the separator, thereby triggering the thermal runaway of the battery cell. Less heat is required to melt the separator, and the additional energy introduced is reduced. Due to the small thickness of the separator, the melting is fast, so that the time for triggering the thermal runaway of the battery cell is short.

In some embodiments of the present application, the heating of the separator of the electrode assembly of the battery cell by the heating member includes:
  heating the separator by the heating member that is connected to the separator.

In the above technical solution, the heating member is connected to the separator, the heat generated by the heating member can then be fully used to melt the separator, so that the additional energy introduced can be reduced. Since the heating member is connected to the separator, the heat generated by the heating member can be quickly transferred to the separator, so that the separator is quickly melted, thereby shortening the time for triggering the thermal runaway.

In some embodiments of the present application, before the heating of the inside of the battery cell by the heating member, the thermal runaway trigger method further includes:
  electrically connecting an external power source to the heating member.

In the above technical solution, the heating member is powered by the external power source such that the heating member heats the inside of the battery cell. In this way, the heating member can be controlled to start or stop heating the inside of the battery cell by turning on or off the electrical connection between the external power source and the heating member, and the heating time and the heating power are easy to control.

In some embodiments of the present application, the thermal runaway trigger method further includes:
  disconnecting the external power source from the heating member after the thermal runaway of the battery cell, such that the heating member stops heating the inside of the battery cell.

In the above technical solution, after the thermal runaway of the battery cell, the electrical connection between the external power source and the heating member is turned off, and the external power source stops supplying electric energy to the heating member, so that the heating member stops heating. Turning off the electrical connection between the external power source and the heating member can reduce the consumption of external energy and avoid causing other safety problems.

In some embodiments of the present application, the providing of the battery cell and the heating member includes:
  connecting the heating member to the electrode assembly of the battery cell.

In the above technical solution, the heating member is connected to the electrode assembly of the battery cell, so that the heating member can directly heat the electrode assembly, and it is easier to trigger the thermal runaway of the battery cell.

In some embodiments of the present application, the connecting of the heating member to the electrode assembly of the battery cell includes:
connecting the heating member to the separator of the electrode assembly.

In the above technical solution, the heating member is connected to the separator, the heat generated by the heating member can then be fully used to melt the separator, so that the additional energy introduced can be reduced. Since the heating member is connected to the separator, the heat generated by the heating member can be quickly transferred to the separator, so that the separator is quickly melted, thereby shortening the time for triggering the thermal runaway.

In some embodiments of the present application, after the connecting of the heating member to the electrode assembly of the battery cell, the providing of the battery cell and the heating member further includes:
receiving the electrode assembly into a case from an opening of the case; and
closing the opening with an end cap.

In the above technical solution, after the heating member is connected to the electrode assembly, the electrode assembly having the heating member connected thereto is placed into the case from the opening of the case, and it is possible that the heating member is arranged in the case while the electrode assembly is placed in the case, facilitating the connection of the heating member to the electrode assembly and improving the efficiency of assembly production.

In some embodiments of the present application, before the closing of the opening with the end cap, the providing of the battery cell and the heating member further includes:
passing wires connected to the heating member out of a through hole in the end cap; and
before the heating of the inside of the battery cell by the heating member, the thermal runaway trigger method further includes:
electrically connecting the external power source to the wires.

In the above technical solution, before the case is closed with the end cap, the wires connected to the heating member pass out of the through hole in the end cap; and after the case is closed with the end cap, one end of each wire is located outside the battery cell, facilitating the electrical connection of the wire to the external power source.

In some embodiments of the present application, after the passing of the wires connected to the heating member out of the through hole in the end cap, the providing of the battery cell and the heating member further includes:
inserting a sealing member into the through hole to seal the end cap and the wires.

In the above technical solution, the wires and the end cap are sealed by the sealing member, so that the airtightness of the battery cell can be ensured, and a more realistic thermal runaway scenario can be simulated, avoiding distorted simulation due to the discharge of gas from the battery cell through the through hole as the through hole is provided in the end cap.

In some embodiments of the present application, the sealing member includes mounting holes for allowing the wires to pass out and a notch for allowing the wires to be snapped into the mounting holes; and before the inserting of the sealing member into the through hole, the providing of the battery cell and the heating member further includes:
snapping the wires into the mounting holes from the notch.

In the above technical solution, the wires are snapped into and mounted in the mounting holes of the sealing member from the notch of the sealing member, to facilitate the wires to pass through the sealing member, and the notch can also provide a compression margin for the interference fit between the sealing member and a hole wall of the through hole.

In some embodiments of the present application, the wires are arranged in one-to-one correspondence with the mounting holes; and
the snapping of the wires into the mounting holes from the notch includes:
snapping the wires into the corresponding mounting holes from the notch.

In the above technical solution, the wires are arranged in one-to-one correspondence with the mounting holes, and the wires are snapped into the corresponding mounting holes from the notch, that is, one wire is arranged in one mounting hole in a penetrating manner, so that the hole wall of the mounting hole can be more attached to a peripheral wall of the wire, ensuring the sealing performance.

In some embodiments of the present application, the thermal runaway trigger method further includes:
covering the heating member by an insulating member, and then connecting the heating member covered by the insulating member to the electrode assembly.

In the above technical solution, after covering the heating member by the insulating member, the heating member covered by the insulating member is connected to the electrode assembly, so that other safety problems caused by the electrical connection between the heating member and the electrode assembly can be avoided.

DESCRIPTION OF DRAWINGS

To more clearly describe the technical solutions of the embodiments of the present application, the drawings to be used in the embodiments will be briefly introduced below, and it should be understood that the following drawings only show some embodiments of the present application, and therefore should not be considered as limiting the scope of the present application. For those of ordinary skill in the art, other relevant drawings may also be obtained based on these drawings without involving any inventive effort.

List of reference signs: 100—Battery cell; 10—Case; 11—Opening; 20—Electrode assembly; 30—End cap assembly; 31—End cap; 32—First electrode terminal; 33—Second electrode terminal; 34—Pressure relief mechanism; 35—Through hole; 40—Adapter; 50—Sealing member; 51—Mounting hole; 52—Notch; 53—Insertion portion; 531—First tapered section; 532—Second tapered section; 54—Shielding portion; 200—Heating member; 300—Wire; 400—External power source; 500—Electrical control device; 510—Apparatus switch; 520—Current regulator; 530—Voltage regulator; 540—Digital display screen; 600—Insulating member.

DETAILED DESCRIPTION

In order to make the objectives, technical solutions and advantages of the embodiments of the present application clearer, the technical solutions in the embodiments of the present application will be clearly and completely described below with reference to the drawings for the embodiments of the present application. Apparently, the described embodiments are some of, rather than all of, the embodiments of the present application. The assembly of the embodiments of the present application generally described and illustrated in the drawings herein can be arranged and designed in a variety of different configurations.

Therefore, the following detailed description of the embodiments of the present application, which are set forth in the drawings, is not intended to limit the scope of protection of the present application, but is merely representative of selected embodiments of the present application. On the basis of the embodiments of the present application, all other embodiments obtained by those of ordinary skill in the art without involving any inventive effort shall fall within the scope of protection of the present application.

It should be noted that the embodiments in the present application and the features of the embodiments can be combined with each other without conflict.

It should be noted that like numerals and letters refer to like items in the following figures, so once an item is defined in one figure, it does not require further definition and explanation in subsequent figures.

In the description of the embodiments of the present application, it should be noted that the indicated orientation or positional relationships are based on the orientation or positional relationships shown in the accompanying drawings, or are orientation or positional relationships in which a product of the present application is conventionally placed when in use, or are orientation or positional relationships commonly understood by those skilled in the art, and are intended to facilitate the description of the present application and simplify the description only, rather than indicating or implying that the device or element referred to must have a particular orientation or be constructed and operated in a particular orientation, and therefore cannot be construed as limiting the present application. In addition, the terms "first", "second", "third", etc. are for discriminative description purposes only and should not be construed as indicating or implying relative importance.

At present, from the development of market situation, application of traction batteries is becoming more and more extensive. Power batteries are used in energy storage power source systems such as hydraulic, thermal, wind and solar power stations as well as in electric vehicles such as electric bicycles, electric motorcycles and electric cars, and military equipment and aerospace fields. With the continuous expansion of the application field of the power batteries, the market demand is also constantly expanding.

Due to manufacturing defects or improper use of a battery, a lithium-ion battery may be subjected to a thermal runaway in extreme cases, causing the internal temperature of the battery to rise, which eventually leads to a chain reaction of thermal runaway, causing the battery to catch fire and explode. The process of thermal runaway will cause thermal runaway to propagation. Thermal runaway and thermal runaway propagation accidents are very likely to cause casualties and property losses. The thermal runaway of the battery cannot be absolutely avoided, and only the possibility of occurrence, or the harm of the thermal runaway of the battery can be reduced. It is necessary to pre-evaluate the greatest harm of the thermal runaway and runaway propagation behaviors of the battery, and consider it in practice.

The inventors have noticed that the greatest harm of the thermal runaway and runaway propagation behaviors of the battery is mainly evaluated by simulating the triggering of a thermal runaway of a battery cell and observing the thermal runaway and runaway propagation of the battery. At present, the methods commonly used to trigger the thermal runaway of the battery cell include needle penetration, external heating, overcharging, etc. The needle penetration trigger method is to penetrate the battery cell from the outside to cause a short-circuit inside the battery cell. However, the needle penetration trigger will destroy the battery cell or the external structure or sealing structure of a battery pack system, resulting in a distorted simulation of the thermal runaway behavior. External heating is to heat the battery cell from the outside of the battery cell, so that the internal material of the battery cell is deteriorated or the internal pressure is out of control, etc., causing a thermal runaway of the battery cell. Overcharging is to supplement the electric energy of the battery cell beyond its rated electric energy, causing a thermal runaway of the battery cell. External heating and overcharging both require a large additional injection of energy. Moreover, the existing trigger methods are difficult to simulate the actual thermal runaway process of the battery. In addition, the devices for the existing trigger methods are limited by the size of the space, it is actually difficult to assemble them into the battery cell or battery, and other structural members have to be sacrificed to achieve the purpose of assembly.

Based on the above considerations, in order to more realistically simulate the thermal runaway and thermal runaway propagation behaviors of the battery and reduce the input of additional energy, the inventors have conducted in-depth research and provided a thermal runaway trigger method, in which a heating member is arranged inside a battery cell, and the inside of the battery cell is heated by the heating member to cause a thermal runaway of the battery cell.

The heating member is arranged inside the battery cell, and the heating member heats the inside of the battery cell to cause the thermal runaway of the battery cell, so that the inside of the battery cell can be heated to cause the thermal runaway of the battery cell in a relatively short time. The heating member is arranged inside the battery cell. Due to the reduced internal space of the battery cell, the range of diffusion of the heating member inside the battery cell is small, and the heat loss of the heating member is relatively small, so that the introduction of a relatively small amount of external energy can trigger the thermal runaway of the battery cell. The heating member heats the inside of the battery cell without destroying the structure of the battery cell, the airtightness of the battery cell to be tested is ensured, and the behavior of the battery cell can be simulated closer to the real thermal runaway, facilitating the determination of a scheme to reduce the thermal runaway of the battery cell and a scheme to reduce the loss during the thermal runaway of the battery cell according to the simulated thermal runaway process.

The thermal runaway trigger method disclosed in the embodiments of the present application can be used to trigger the thermal runaway of battery cells or batteries used in vehicles, ships, aircrafts, etc. so as to simulate the thermal runaway and thermal runaway propagation behaviors of the battery cells or batteries in different use environments.

In the following embodiments, for convenience of description, a thermal runaway trigger method is described by taking a battery cell 100 provided in the embodiments of the present application as an example.

Figure 1:
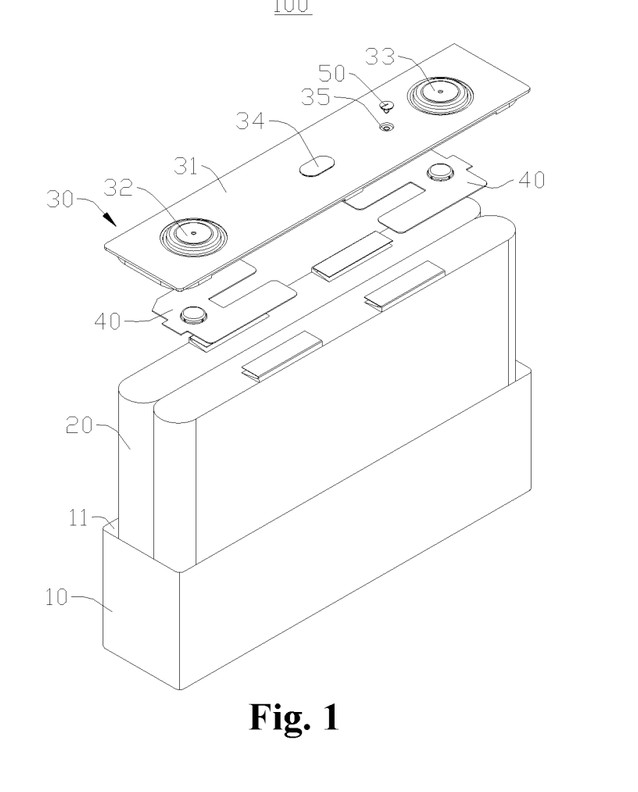
FIG. 1 is an exploded view of a battery cell provided in some embodiments of the present application.

Referring to FIG. 1, the battery cell 100 may include a case 10, an electrode assembly 20 and an end cap assembly 30. The case 10 has an opening 11, the electrode assembly 20 is received in the case 10, and the end cap assembly 30 is configured to cover the opening 11.

The case 10 may have various shapes, such as a cylinder or a cuboid. The case 10 may be shaped according to the specific shape of the electrode assembly 20. For example, if the electrode assembly 20 is of a cylindrical structure, the case 10 may use a cylindrical structure; and if the electrode assembly 20 is of a cuboid structure, the case 10 may use a cuboid structure. FIG. 1 illustratively shows the situation where the case 10 and the electrode assembly 20 are square.

The case 10 may be made of various materials, such as copper, iron, aluminum, stainless steel, aluminum alloy, and plastic, which will not be particularly limited in the embodiments of the present application.

The electrode assembly 20 may include a positive electrode sheet (not shown in the figures), a negative electrode sheet (not shown in the figures) and a separator (not shown in the figures). The electrode assembly 20 may be of a winding structure formed by winding the positive electrode sheet, the separator and the negative electrode sheet, or a laminated structure formed by laminating the positive electrode sheet, the separator film and the negative electrode sheet. The electrode assembly 20 also includes a positive tab (not shown in the figures) and a negative tab (not shown in the figures). A positive electrode current collector in the positive electrode sheet that is not coated with a positive electrode active material layer may be used as the positive tab, and a negative electrode current collector in the negative electrode sheet that is not coated with a negative electrode active material layer may be used as the negative tab. The electrode assembly 20 may be a wound electrode assembly or a laminated electrode assembly.

The battery cell 100 may include one or a plurality of battery assemblies 20. By "a plurality of" means two or more.

The end cap assembly 30 is configured to cover the opening 11 of the case 10 to form a closed receiving space (not shown in the figures). The receiving space is used for receiving the electrode assembly 20. The receiving space is also configured to receive an electrolyte, such as an electrolyte solution. The end cap assembly 30 is used as a component for outputting the electric energy of the electrode assembly 20, and an electrode terminal in the end cap assembly 30 is configured to be electrically connected to the electrode assembly 20, that is, the electrode terminal is electrically connected to a respective tab of the electrode assembly 20. For example, the electrode terminal is connected to the tab via an adapter 40 to realize the electrical connection between the electrode terminal and the tab.

It should be noted that there may be one or two openings 11 of the case 10. If there is one opening 11 of the case 10, there also may be one end cap assembly 30, and then two electrode terminals may be arranged in the end cap assembly 30. The two electrode terminals are respectively configured to be electrically connected to the positive tab and the negative tab of the electrode assembly 20, and the two electrode terminals in the end cap assembly 30 are respectively a positive electrode terminal and a negative electrode terminal. If there are two openings 11 of the case 10, for example, two openings 11 are provided on two opposite sides of the case 10, there may also be two end cap assemblies 30, and the two end cap assemblies 30 respectively close the two openings 11 of the case 10. In this case, it is possible that the electrode terminal in one end cap assembly 30 is a positive electrode terminal for electrical connection with the positive tab of the electrode assembly 20; and the electrode terminal in the other end cap assembly 30 may be a negative electrode terminal for electrical connection with the negative electrode sheet of the electrode assembly 20.

Still referring to FIG. 1, the end cap assembly 30 may include an end cap 31, a first electrode terminal 32, a second electrode terminal 33 and a pressure relief mechanism 34.

The first electrode terminal 32 and the second electrode terminal 33 are both mounted on the end cap 31; and the first electrode terminal 32 and the second electrode terminal 33 are electrically connected to the positive tab and the negative tab respectively. The pressure relief mechanism 34 is arranged at the end cap 31, and the pressure relief mechanism 34 is at least partially located between the first electrode terminal 32 and the second electrode terminal 33. The pressure relief mechanism 34 is configured to be actuated when the internal pressure or temperature of the battery cell 100 reaches a threshold value, so as to release the internal pressure of the battery cell 100.

Figure 2:
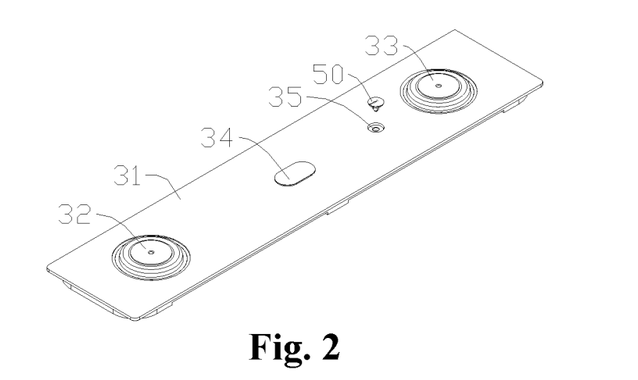
FIG. 2 is a schematic diagram of an end cap assembly not assembled with a sealing member provided in some embodiments of the present application.
Figure 3:
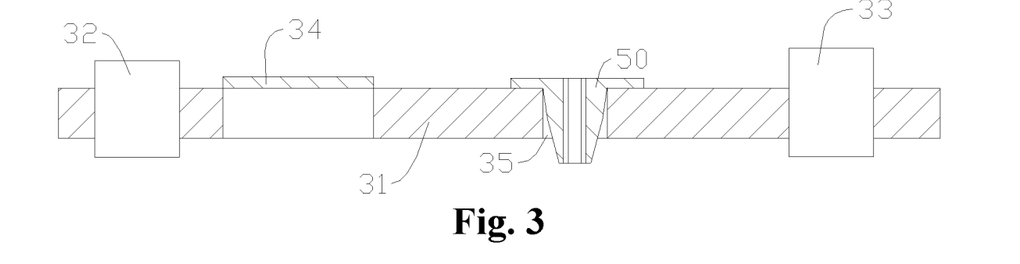
FIG. 3 is a cross-sectional view of an end cap assembly assembled with a sealing member provided in some embodiments of the present application.

Referring to FIGS. 2 and 3, in order to facilitate the mounting of an apparatus for implementing the thermal runaway trigger method, in some embodiments, the end cap 31 is further provided with a through hole 35, through which part or all of the structure of the apparatus for implementing the thermal runaway trigger method passes into or out of the inside of the battery cell 100.

In order to ensure the airtightness of the battery cell 100 when the thermal runaway of the battery is triggered, in some embodiments, the battery cell 100 further includes a sealing member 50. The sealing member 50 is inserted in the through hole 35 so that the part or all of the structure of the apparatus for implementing the thermal runaway trigger method that passes through the through hole is sealed from the through hole 35.

Figure 4:
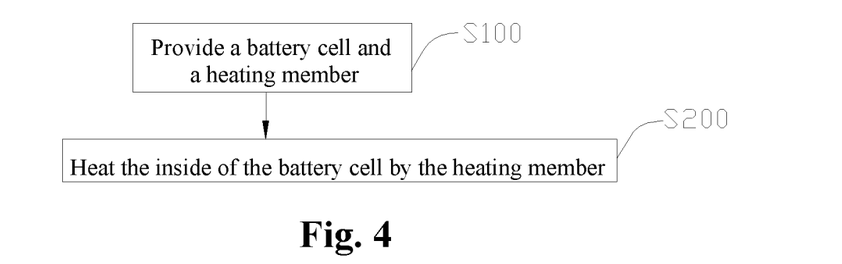
FIG. 4 is a flowchart of a thermal runaway trigger method provided in some embodiments of the present application.

Referring to FIG. 4, an embodiment of the present application provides a thermal runaway trigger method, including:

a step S100 of providing a battery cell 100 and a heating member 200 (shown in FIG. 14), the heating member 200 being arranged in the battery cell 100; and a step S200 of heating the inside of the battery cell 100 by the heating member 200, so as to cause a thermal runaway of the battery cell 100.

In step S100, the heating member 200 is arranged in the battery cell 100. In fact, the heating member 200 is arranged in a case 10 of the battery cell 100. The heating member 200 and the electrode assembly 20 are both placed into the case 10 from an opening 11 of the case 10. In the case 10, the heating member 200 may be connected to an inner wall of the case 10, or the heating member 200 may be connected to the electrode assembly 20 in the case 10. The heating member 200 may be arranged in the case 10 before the electrode assembly 20 is placed into the case 10, or the heating member 200 may be arranged in the case 10 after the electrode assembly 20 is placed into the case 10. It is also possible that the heating member 200 is connected to the electrode assembly 20 first, and then placed into the case 10 together with the electrode assembly 20.

The heating member 200 may be a heating wire, or may be a component provided with a material that produces an exothermic reaction after coming into contact with the material inside the battery cell 100.

In step S200, it is possible that the heat generated by the heating member 200 causes the internal pressure or temperature of the battery cell 100 to rise sharply, thereby causing the thermal runaway of the battery cell 100; it is also possible that the heat generated by the heating member 200 causes the ambient temperature inside the battery cell 100 to rise, so that the structure (such as the electrode assembly 20 and the electrolyte solution) inside the battery cell 100 is in a high-temperature environment and the material deteriorates, thereby causing the thermal runaway of the battery cell 100; and it is also possible that the heat of the heating member 200 causes a short-circuit inside the battery cell 100, thereby causing the thermal runaway of the battery cell 100.

The heating member 200 is arranged inside the battery cell 100, and the heating member 200 heats the inside of the battery cell 100 to cause the thermal runaway of the battery cell 100, so that the inside of the battery cell 100 can be heated to cause the thermal runaway of the battery cell 100 in a relatively short time. The heating member 200 is arranged inside the battery cell 100. Due to the reduced internal space of the battery cell 100, the range of diffusion of the heating member 200 inside the battery cell 100 is small, and the heat loss of the heating member 200 is relatively small, so that the introduction of a relatively small amount of external energy can trigger the thermal runaway of the battery cell 100. The heating member 200 heats the inside of the battery cell 100 without destroying the structure of the battery cell 100, the airtightness of the battery cell 100 to be tested is ensured, and the behavior of the battery cell 100 can be simulated closer to the real thermal runaway, facilitating the determination of a scheme to reduce the thermal runaway of the battery cell 100 and a scheme to reduce the loss during the thermal runaway of the battery cell 100 according to the simulated thermal runaway process.

Figure 5:
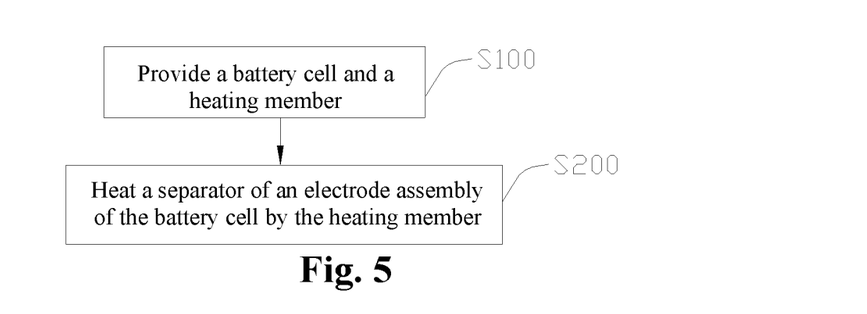
FIG. 5 is a flowchart of a thermal runaway trigger method provided in some other embodiments of the present application.

As shown in FIG. 5, in some embodiments, in step S200, the heating of the inside of the battery cell 100 by the heating member 200 includes:

heating a separator of an electrode assembly 20 of the battery cell 100 by the heating member 200 to melt the separator, so as to cause a short-circuit inside the battery cell 100.

The positive electrode sheet and the negative electrode sheet of the electrode assembly 20 are separated by the separator, so as to avoid the short-circuit inside the battery cell 100 caused by the contact between the positive electrode sheet and the negative electrode sheet. After the heating member 200 heats the separator, the separator is melted, and the positive electrode sheet may come into contact with the negative electrode sheet, thereby causing a short-circuit inside the battery cell 100, and in turn triggering the thermal runaway of the battery cell 100.

The short-circuit inside the battery cell 100 is caused by melting the separator, thereby triggering the thermal runaway of the battery cell 100. Less heat is required to melt the separator, and the additional energy introduced is reduced. Due to the small thickness of the separator, the melting is fast, so that the time for triggering the thermal runaway of the battery cell 100 is short.

Figure 6:
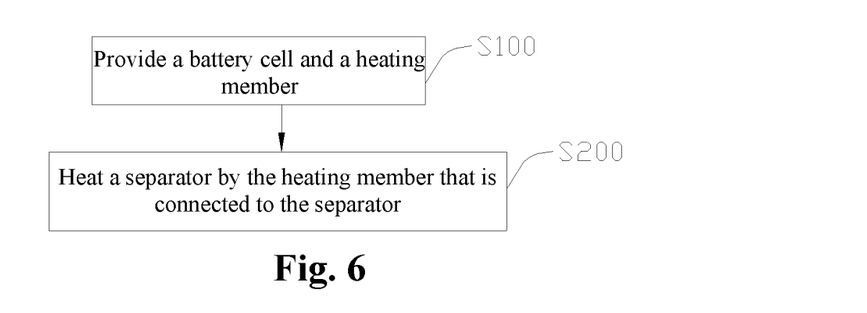
FIG. 6 is a flowchart of a thermal runaway trigger method provided in still some other embodiments of the present application.

As shown in FIG. 6, in some embodiments, the heating of the separator of the electrode assembly 20 of the battery cell 100 by the heating member 200 includes:

heating the separator by the heating member 200 connected to the separator.

The heating member 200 connected to the separator means that the heating member 200 is closely attached to the separator, and the heat from the heating member 200 can reach the separator in a very short time and transmission distance. The heating member 200 may be directly connected to the separator, or may be indirectly connected to the separator.

The heating member 200 is connected to the separator, the heat generated by the heating member 200 can then be fully used to melt the separator, so that the additional energy introduced can be reduced. Since the heating member 200 is connected to the separator, the heat generated by the heating member 200 can be quickly transferred to the separator, so that the separator is quickly melted, thereby shortening the time for triggering the thermal runaway.

Figure 7:
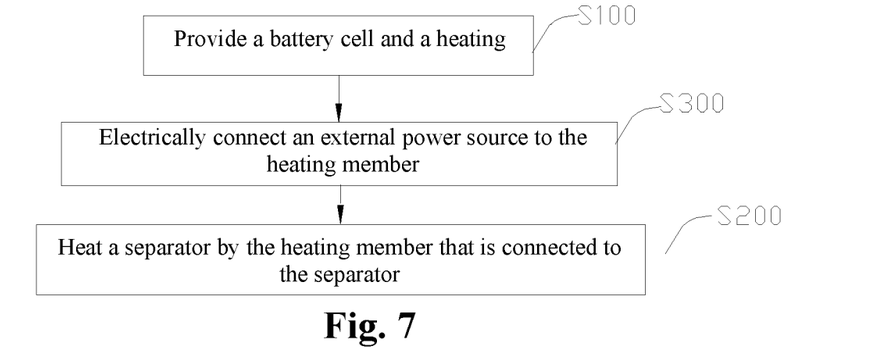
FIG. 7 is a flowchart of a thermal runaway trigger method provided in yet some other embodiments of the present application.

As shown in FIG. 7, in some embodiments, before the heating of the inside of the battery cell 100 by the heating member 200, the thermal runaway trigger method further includes:

a step S300 of electrically connecting an external power source 400 (shown in FIG. 17) to the heating member 200.

The external power source 400 refers to a further power source located outside the battery cell 100, i.e. the battery cell 100 to be used for simulating the thermal runaway. The external power source 400 is configured to supply power to the heating member for heating. The heating member 200 may be a heating wire made of a metal conductor, and the metal conductor may be copper. The resistance range of the metal conductor is designed to be 0Ω to 100Ω. The external power source 400 is connected to the heating member 200 via wires 300, and an electrical control device 500 (shown in FIG. 17) may also be arranged between the external power source 400 and the heating member 200. The electrical control device 500 includes an apparatus switch 510, a current regulator 520, a voltage regulator 530 and a digital display screen 540. The apparatus switch 510 is configured to turn on or off the electrical connection between the external power source 400 and the heating member 200, the current regulator 520 is configured to regulate the output current value and convert the alternating current into direct current, and the voltage regulator 530 is configured to regulate the output voltage value, and the digital display screen 540 is configured to display the current values of current and voltage, whether the current is DC or AC, and other information. Therefore, the electrical control device 500 may set the required voltage and current values to precisely control the heating power of the heating member 200, so as to ensure high repeatability of the thermal runaway simulation test results.

The heating member 200 is powered by the external power source 400 such that the heating member 200 heats the inside of the battery cell 100. In this way, the heating member 200 can be controlled to start or stop heating the inside of the battery cell 100 by turning on or off the electrical connection between the external power source 400 and the heating member 200, and the heating time and the heating power are easy to control.

Figure 8:
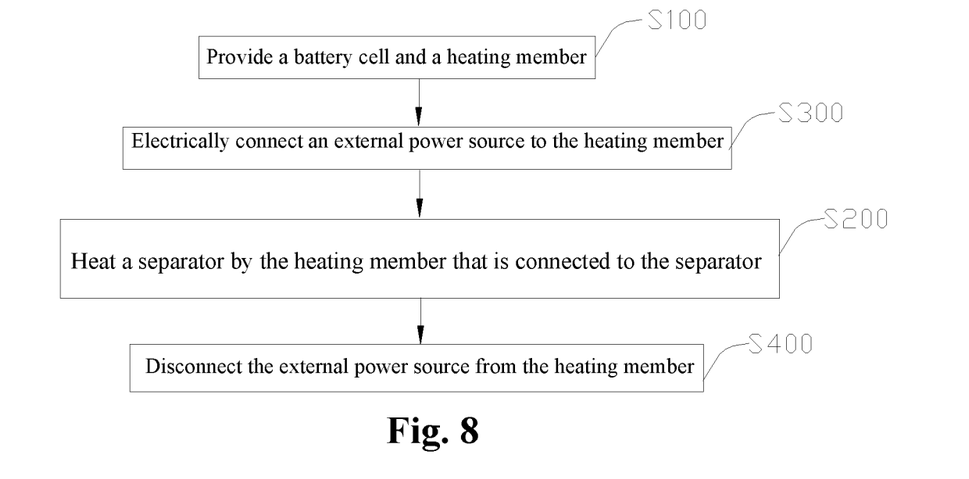
FIG. 8 is a flowchart of a thermal runaway trigger method provided in yet still some other embodiments of the present application.

As shown in FIG. 8, in some embodiments, the thermal runaway trigger method further includes:

a step S400 of disconnecting the external power source 400 from the heating member 200 after the thermal runaway of the battery cell 100, such that the heating member 200 stops heating the inside of the battery cell 100.

Disconnecting the external power source 400 from the heating member 200 actually refers to turning off the electrical connection between the external power source 400 and the heating member 200, so that the electric energy of the external power source 400 cannot be delivered to the heating member 200. Disconnecting the external power source 400 from the heating member 200 can be realized by means of the electrical control device 500. After the thermal runaway of the battery cell 100, if the external power source 400 continues to supply energy to the heating member 200, the heating member 200 will continue to generate heat, which may cause other safety problems.

After the thermal runaway of the battery cell 100, the electrical connection between the external power source 400 and the heating member 200 is turned off, and the external power source 400 stops supplying electric energy to the heating member 200, so that the heating member 200 stops heating. Turning off the electrical connection between the external power source 400 and the heating member 200 can reduce the consumption of external energy and avoid causing other safety problems.

Figure 9:
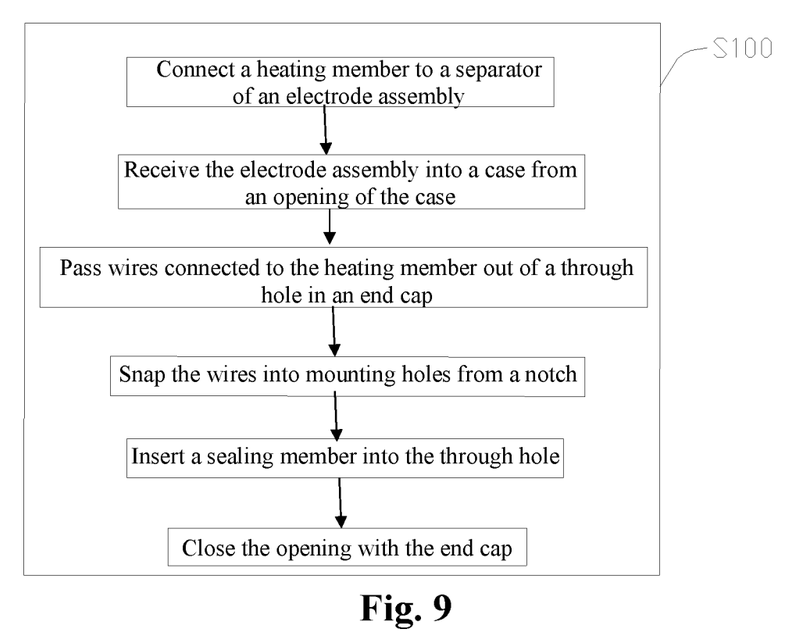
FIG. 9 is a flowchart of a method for providing a battery cell and a heating member provided in some embodiments of the present application.

As shown in FIG. 9, in some embodiments, in step S100, the providing of the battery cell 100 and the heating member includes:

connecting the heating member 200 to the electrode assembly 20 of the battery cell 100.

The heating member 200 may be connected to the positive electrode sheet, the negative electrode sheet or the separator of the electrode assembly 20, and the connection position of the heating member 200 is selected according to actual requirements.

The position where the electrode assembly 20 is connected to the heating member 200 is not necessarily a plane. For example, in an embodiment where the electrode assembly 20 is a cylindrical electrode assembly 20, an outer peripheral surface of the electrode assembly 20 is a curved surface, and the heating member 200 needs to adapt to the shape of the electrode assembly 20, in order to prevent the electrode assembly 20 from being damaged due to the mismatch between the shapes of the heating member 200 and the electrode assembly 20. In some embodiments, the heating member 200 may have a better flexibility, and can use its own flexibility to adapt to the shape of the electrode assembly 20, so that the heating member 200 is attached to the electrode assembly 20; or the heating member 200 may be shaped to match the shape of the electrode assembly 20, so that the heating member 200 is attached to the electrode assembly 20.

The heating member 200 is connected to the electrode assembly 20 of the battery cell 100, so that the heating member 200 can directly heat the electrode assembly 20, and it is easier to trigger the thermal runaway of the battery cell 100.

Still referring to FIG. 9, in some embodiments, the connecting of the heating member 200 to the electrode assembly 20 of the battery cell 100 includes:

connecting the heating member 200 to the separator of the electrode assembly 20.

The heating member 200 may be connected to the outermost layer of separator of the electrode assembly 20, or may be connected to the inner layer of separator.

The heating member 200 is connected to the separator, the heat generated by the heating member 200 can then be fully used to melt the separator, so that the additional energy introduced can be reduced. Since the heating member 200 is connected to the separator, the heat generated by the heating member 200 can be quickly transferred to the separator, so that the separator is quickly melted, thereby shortening the time for triggering the thermal runaway.

Still referring to FIG. 9, in some embodiments, after the connecting of the heating member 200 to the electrode assembly 20 of the battery cell 100, in step S100, the providing of the battery cell 100 and the heating member 200 further includes:

receiving the electrode assembly 20 into a case 10 from an opening 11 of the case 10; and closing the opening 11 with an end cap 31.

Before the electrode assembly 20 is received into the case 10, the heating member 200 is connected to the electrode assembly 20, and the heating member 200 and the electrode assembly 20 can be placed into the case 10 from the opening 11 of the case 10 as a whole. In other embodiments, it is also possible that the electrode assembly 20 is placed into the case 10, and then the heating member 200 is connected to the electrode assembly 20 located inside the case 10.

After the heating member 200 is connected to the electrode assembly 20, the electrode assembly 20 having the heating member 200 connected thereto is placed into the case 10 from the opening 11 of the case 10, and it is possible that the heating member 200 is arranged in the case 10 while the electrode assembly 20 is placed in the case 10, facilitating the connection of the heating member 200 to the electrode assembly 20 and improving the efficiency of assembly production.

Still referring to FIG. 9, in some embodiments, before the closing of the opening 11 with the end cap 31, in step S100, the providing of the battery cell 100 and the heating member 200 further includes:

passing wires 300 (shown in FIG. 11) connected to the heating member 200 out of a through hole 35 in the end cap 31; and before the heating of the inside of the battery cell 100 by the heating member 200, the thermal runaway trigger method further includes:

electrically connecting the external power source 400 to the wires 300.

In an embodiment in which the heating member 200 heats the inside of the battery cell 100 through the electric energy of the external power source 400, the external power source 400 is connected to the heating member 200 via wires 300, one end of each wire 300 is located inside the battery cell 100 and connected to the heating member 200, the other end of the wire 300 needs to extend out of the battery cell 100 to connect to the external power source 400. After the opening 11 of the case 10 is closed with the end cap 31, it is difficult for the wire 300 to enter the battery cell 100 so as to connect to the heating member 200 or for the wire 300 to pass out of the battery cell 100 so as to connect to the external power source 400. First, one end of the wire 300 is connected to the heating member 200, a through hole 35 is provided in the end cap 31, the other end of the wire 300 passes through the through hole 35 in the end cap 31 and extends to the outside of the battery cell 100, and the end cap 31 is sleeved on the outer periphery of the wire 300. Then, the opening 11 of the case 10 is closed with the end cap 31.

Before the case 10 is closed with the end cap 31, the wires 300 connected to the heating member 200 pass out of the through hole 35 in the end cap 31; and after the case 10 is closed with the end cap 31, one end of each wire 300 is located outside the battery cell 100, facilitating the electrical connection of the wire 300 to the external power source 400.

Still referring to FIG. 9, in some embodiments, after the passing of the wires 300 connected to the heating member 200 out of the through hole 35 in the end cap 31, in step S100, the providing of the battery cell 100 and the heating member 200 further includes:

inserting a sealing member 50 into the through hole 35 to seal the end cap 31 and the wires 300.

After the end cap 31 is provided with the through hole 35 for allowing the wires 300 to pass out, the airtightness of the battery cell 100 will be affected, and the gas inside the battery cell 100 will be discharged from the through hole 35, so that the simulated thermal runaway cannot reflect the thermal runaway and thermal runaway propagation of the battery under real conditions. The inserting of the sealing member 50 into the through hole 35 may be performed before or after the closing of the opening 11 of the case 10 with the end cap 31.

The sealing member 50 is inserted into the through hole 35 to realize the sealing of the wires 300 and the end cap 31, so that the airtightness of the battery cell 100 can be ensured, and a more realistic thermal runaway scenario can be simulated, avoiding distorted simulation due to the discharge of gas from the battery cell 100 through the through hole 35 as the through hole 35 is provided in the end cap 31.

Referring to FIGS. 9, 10, 11 and 12, in some embodiments, the sealing member 50 includes mounting holes 51 for allowing the wires 300 to pass out and a notch 52 for allowing the wires 300 to be snapped into the mounting holes 51; and before the inserting of the sealing member 50 into the through hole 35, the providing of the battery cell 100 and the heating member 200 further includes:

snapping the wires 300 into the mounting holes 51 from the notch 52.

Figure 10:
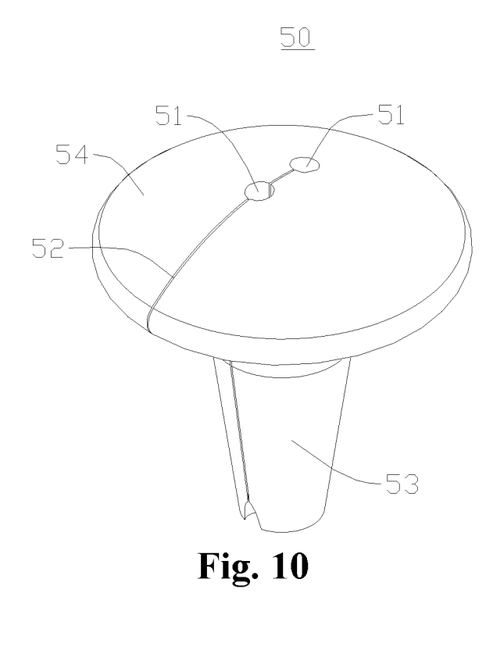
FIG. 10 is an axonometric view of a sealing member provided in some embodiments of the present application.
Figure 11:
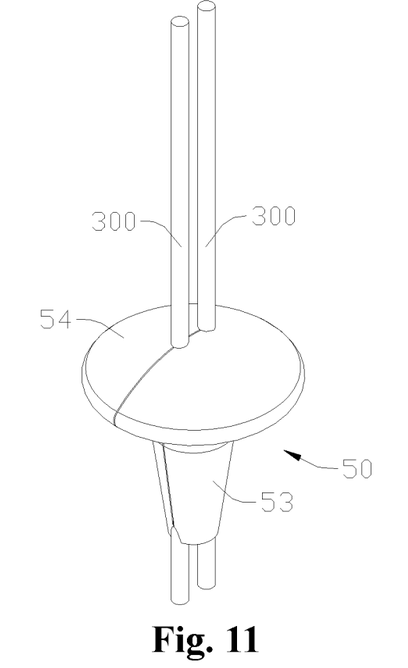
FIG. 11 is a schematic diagram of wires fitted with a sealing member.
Figure 12:
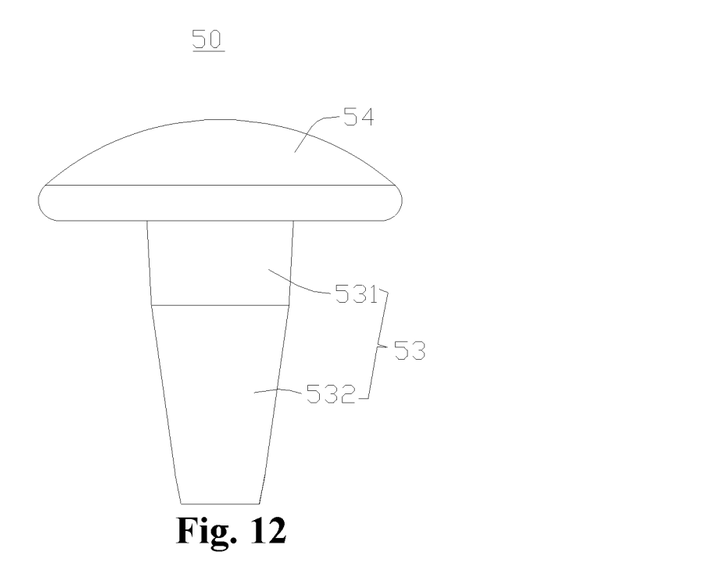
FIG. 12 is a front view of a sealing member provided in some embodiments of the present application.

As shown in FIGS. 10, 11 and 12, the mounting holes 51 run through the inner and outer ends of the sealing member 50, and the wires 300 pass through the mounting holes 51. The wire 300 is the part or all of the structure of the apparatus for implementing the thermal runaway trigger method as described above.

The notch 52 is arranged on an outer peripheral surface of the sealing member 50 and is in communication with the mounting holes 51, the notch 52 runs through the inner and outer ends of the sealing member 50, and the wires 300 are snapped into the mounting holes 51 from the notch 52. The inner and outer ends of the sealing member 50 refer to two ends of the sealing member 50 in an axial direction of the through hole 35. The sealing member 50 includes an insertion portion 53 and a shielding portion 54. One end of the insertion portion 53 is connected to the shielding portion 54, and the insertion portion 53 is configured to be inserted into the through hole 35. The insertion portion 53 includes a first tapered section 531 and a second tapered section 532, the large end of the first tapered section 531 is connected to the shielding portion 54, the small end of the first tapered section 531 is connected to the large end of the second tapered section 532, and the taper of the first tapered section 531 is smaller than that of the second tapered section 532, facilitating the insertion of the insertion portion 53 into the through hole 35. The shielding portion 54 is located outside the battery cell 100 and is configured to shield the through hole 35. The shielding portion 54 may abut against an outer surface of the end cap 31, so as to improve the sealing performance of the sealing member 50 on the end cap 31 and the wires 300 and prevent impurities from falling into the battery cell 100 from the through hole 35.

The inserting of the wires 300 into the mounting holes 51 from the notch 52 may be performed before or after the closing of the opening of the case 10 with the end cap 31.

The wires 300 are snapped into and mounted in the mounting holes 51 of the sealing member 50 from the notch 52 of the sealing member 50, to facilitate the wires 300 to pass through the sealing member 50, and the notch 52 can also provide a compression margin for the interference fit between the sealing member 50 and a hole wall of the through hole 35.

In some embodiments, the wires 300 are arranged in one-to-one correspondence with the mounting holes 51; and the snapping of the wires 300 into the mounting holes 51 from the notch 52 includes:

snapping the wires 300 into the corresponding mounting holes 51 from the notch 52.

As shown in FIGS. 10, 11 and 12, there are two wires 300, and the sealing member 50 is provided with two mounting holes 51 arranged at intervals, and the two mounting holes 51 are both in communication with the notch 52. The wires 300 pass out of the corresponding mounting holes 51.

The wires 300 are arranged in one-to-one correspondence with the mounting holes 51, and the wires 300 are snapped into the corresponding mounting holes 51 from the notch 52, that is, one wire is arranged in one mounting hole 51 in a penetrating manner, so that the hole wall of the mounting hole 51 can be more attached to a peripheral wall of the wire 300, ensuring the sealing performance.

Figure 13:
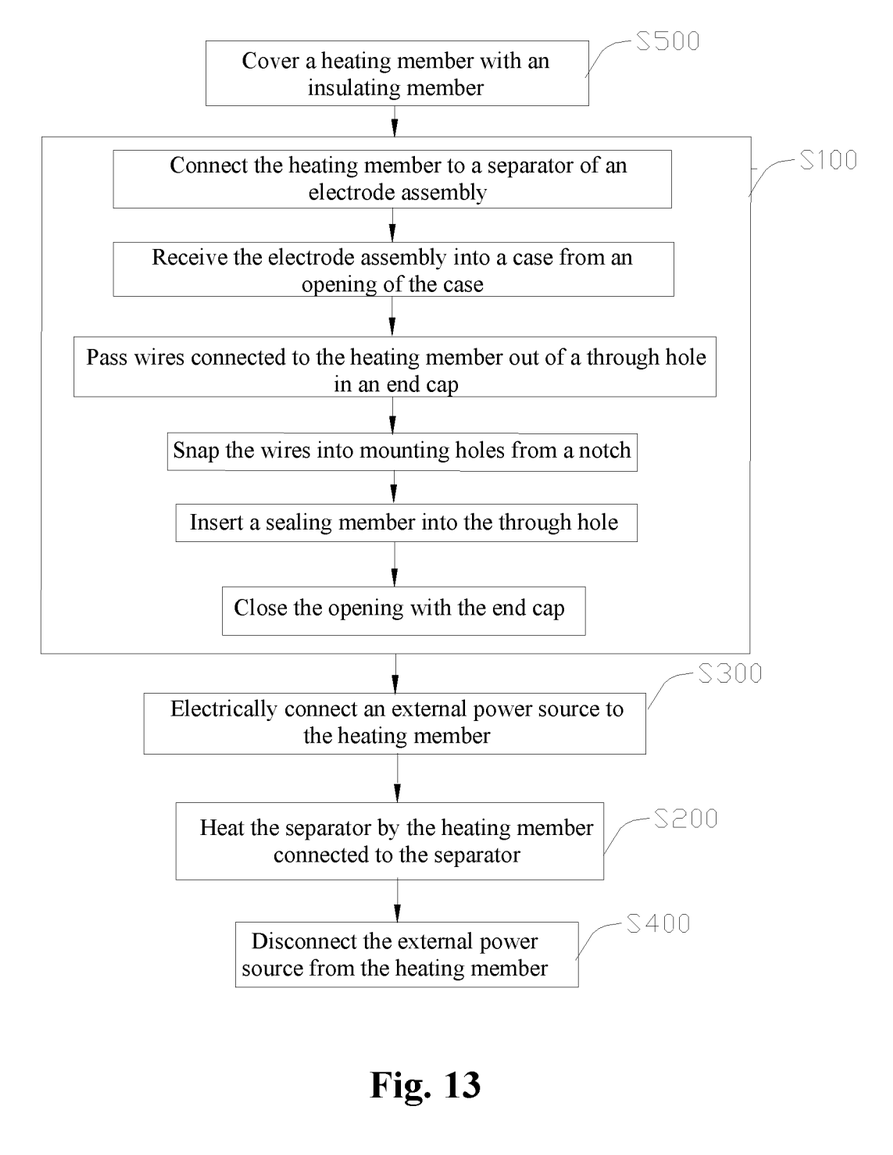
FIG. 13 is a flowchart of a thermal runaway trigger method provided in some further embodiments of the present application.

As shown in FIG. 13, in some embodiments, the thermal runaway trigger method further includes:

a step S500 of covering the heating member 200 by an insulating member 600, and then connecting the heating member 200 covered by the insulating member 600 to the electrode assembly 20.

The insulating member 600 covers the heating member 200, which is equivalent to encapsulating the heating member 200 by the insulating member 600. One end of each wire 300 is connected to the heating member 200, and the other end passes out of the insulating member 600. The insulating member 600 may be made of a high temperature resistant (for example greater than 300° C.) and corrosion resistant material. For example, the insulating member 600 may be made of epoxy resin, polyimide, fluorine rubber, silicone rubber, etc.

After covering the heating member 200 by the insulating member 600, the heating member 200 covered by the insulating member is connected to the electrode assembly 20, so that other safety problems caused by the electrical connection between the heating member 200 and the electrode assembly 20 can be avoided.

Figure 14:
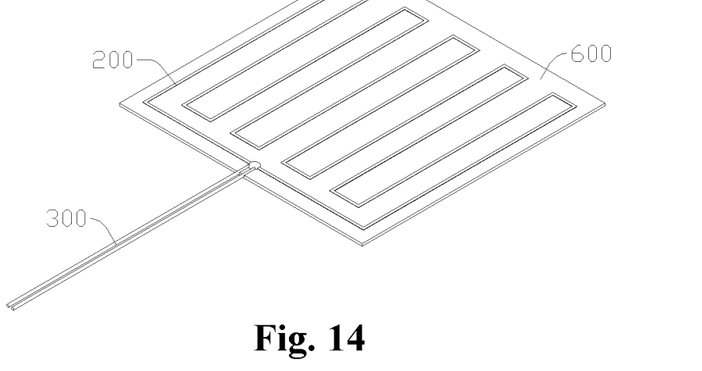
FIG. 14 is a schematic diagram of the connection relationship between a heating member, wires and an insulating member.
Figure 15:
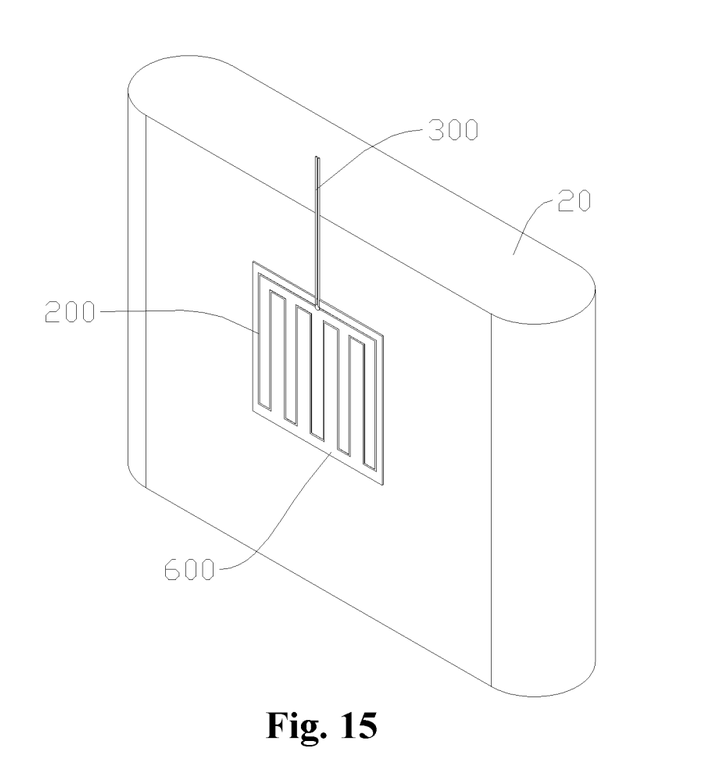
FIG. 15 is a schematic diagram of the connection of a heating member, wires and an insulating member to an electrode assembly.
Figure 16:
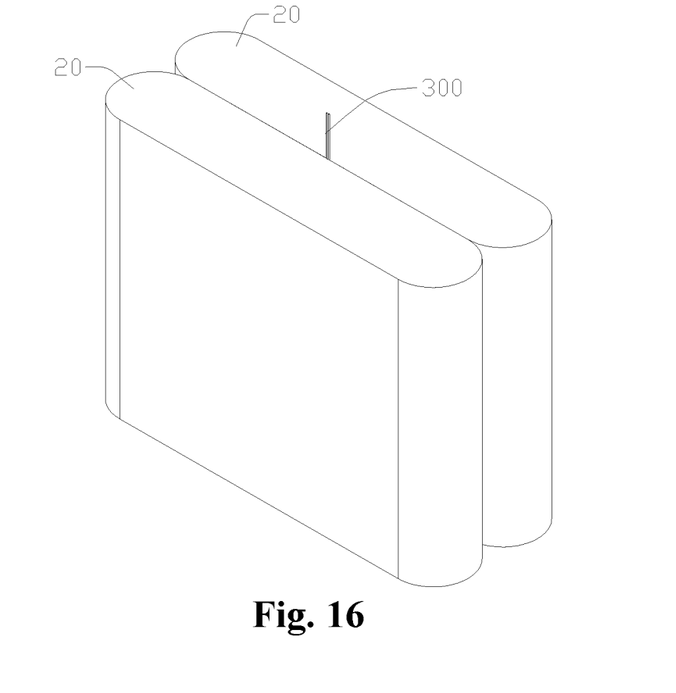
FIG. 16 is a schematic diagram of the connection of a heating member, wires and an insulating member between two electrode assemblies.
Figure 17:
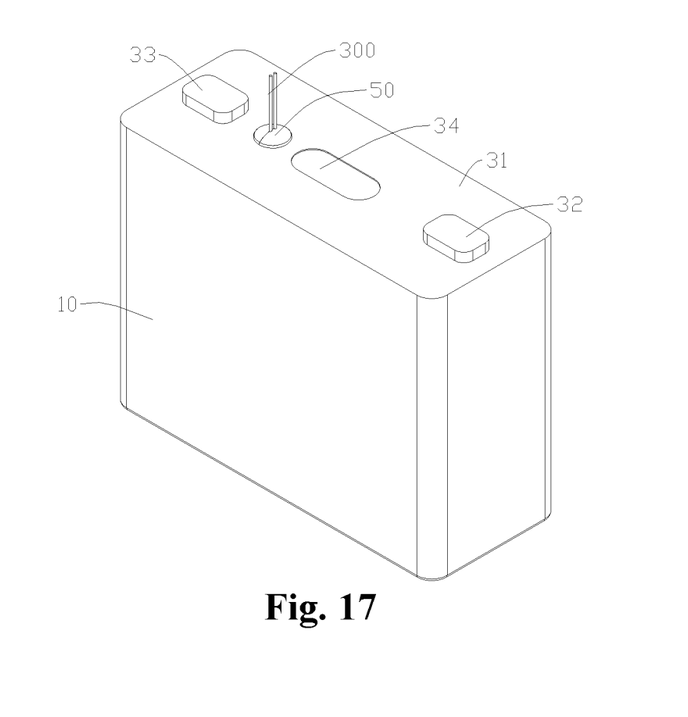
FIG. 17 is a schematic diagram of a battery cell, a heating member and a sealing member after being assembled.
Figure 18:
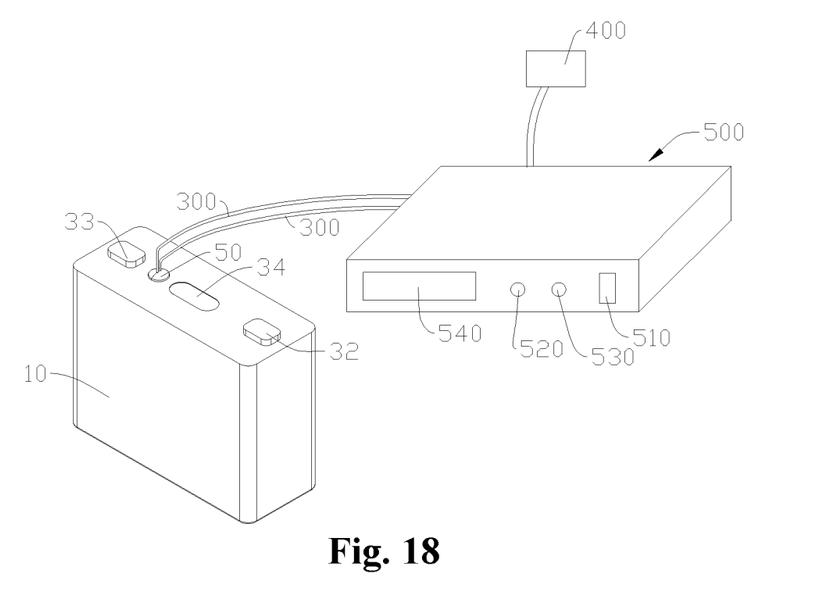
FIG. 18 is a connection diagram of a battery cell, an external power source and an electrical control device.

As shown in FIGS. 13-17, an embodiment of the present application provides a thermal runaway trigger method for a battery cell 100. As shown in FIG. 14, one end of each wire 300 is connected to a heating member 200 and the heating member 200 is packaged by an insulating member 600. As shown in FIG. 15, the heating member 200 packaged by the insulating member 600 is connected to the outermost layer of separator of an electrode assembly 20, so that the electrode assembly 20, the wires 300 and the heating member 200 covered by the insulating member 600 form an integral structure. As shown in FIG. 16, in an embodiment in which the battery cell 100 is provided with a plurality of electrode assemblies 20, the wires 300 and the heating member 200 (not shown in FIG. 16) covered by the insulating member 600 may be arranged between the two electrode assemblies 20. As shown in FIG. 17, the electrode assemblies 20 connected to the heating member 200 is received into a case 10 from an opening 11 of the case 10; the other end of each wire 300 passes out of a through hole 35 of an end cap 31; then the opening 11 of the case 10 is closed with the end cap 31; and the part of each wire 300 that passes out of the through hole 35 of the end cap 31 is snapped into the corresponding mounting hole 51 from a notch 52 of the sealing member 50, and then the sealing member 50 is inserted into the through hole 35 of the end cap 31. As shown in FIG. 18, the end of each wire 300 located outside the battery cell 100 is connected to an external power source 400, and the turning on of the electrical connection between the heating member 200 and the external power source 400, the values of voltage and current, etc., are controlled by an electrical control device 500. Upon the battery cell 100 is subjected to a thermal runaway, the electrical control device 500 cuts off the electrical connection between the heating member 200 and the external power source 400, and the external power source 400 stops supplying electric energy to the heating member 200. The thermal runaway and thermal runaway propagation of the battery cell 100 are observed. In the test of simulating the thermal runaway of a battery pack including a plurality of battery cells 100, it is possible to trigger the thermal runaway of only one of the battery cells 100, and the thermal runaway and thermal runaway propagation of the battery cell 100 are observed.

What are described above are only preferred embodiments of the present application and are not intended to limit the present application. For those skilled in the art, the present application may have various modifications and changes. Any modifications, equivalent substitutions, improvements, etc. made within the spirit and principles of the present application shall fall into the scope of protection of the present application.

The invention claimed is:

1. A thermal runaway trigger method, comprising:
    providing a battery cell comprising an electrode assembly, the electrode assembly comprising a positive electrode sheet, a negative electrode sheet, and a separator that separates the positive electrode sheet and the negative electrode sheet;
    providing a heating member arranged in the battery cell and connected to at least one of the positive electrode sheet, the negative electrode sheet, and the separator;
    receiving the electrode assembly into a case from an opening of the case;
    providing an end cap, the end cap comprising at least one through hole;
    passing wires connected to the heating member out of the at least one through hole;
    inserting a sealing member into the through hole to seal the end cap and the wires, wherein the sealing member comprises an insertion portion and a shielding portion, one end of the insertion portion is connected to the shielding portion, the insertion portion is inserted into the through hole, the shielding portion is located outside the battery cell and abut against an outer surface of the end cap; and
    heating the inside of the battery cell by the heating member to melt the separator and to cause a short-circuit and a thermal runaway of the battery cell.

2. The thermal runaway trigger method according to claim 1, wherein the heating member is connected to the separator.

3. The thermal runaway trigger method according to claim 2, wherein electrode assembly is a wound electrode assembly, the separator is wound and comprises an outermost layer and one or more inner layers, and the heating member is connected to the outermost layer.

4. The thermal runaway trigger method according to claim 2, wherein electrode assembly is a wound electrode assembly, the separator is wound and comprises an outermost layer and one or more inner layers, and the heating member is connected to one of the inner layers.

5. The thermal runaway trigger method according to claim 1, wherein before the heating of the inside of the battery cell by the heating member, the thermal runaway trigger method further comprises:
    electrically connecting an external power source to the heating member.

6. The thermal runaway trigger method according to claim 5, further comprising:
    disconnecting the external power source from the heating member after the thermal runaway of the battery cell, such that the heating member stops heating the inside of the battery cell.

7. The thermal runaway trigger method according to claim 1, wherein after the connecting of the heating member to the electrode assembly of the battery cell, the thermal runaway trigger method further comprises:
    closing the opening with the end cap.

8. The thermal runaway trigger method according to claim 7, wherein, before closing the opening with an end cap, the thermal runaway trigger method further comprises:

placing an adapter between the electrode assembly and the end cap to allow an electrode terminal of the end cap to be electrically connected to the electrode assembly via the adapter.

9. The thermal runaway trigger method according to claim 1, wherein, before the heating of the inside of the battery cell by the heating member, the thermal runaway trigger method further comprises:

electrically connecting an external power source to the wires.

10. The thermal runaway trigger method according to claim 9, wherein the insertion portion comprises a first tapered section and a second tapered section, the first tapered section has a large end and a small end, the large end is connected to the shielding portion, the small end is connected to the large end, and a taper of the first tapered section is smaller than a taper of the second tapered section.

11. The thermal runaway trigger method according to claim 1, wherein the sealing member further comprises mounting holes for allowing the wires to pass through the sealing member and a notch for allowing the wires to be snapped into the mounting holes; and before the inserting of the sealing member into the through hole, the thermal runaway trigger method further comprises:

snapping the wires into the mounting holes from the notch.

12. The thermal runaway trigger method according to claim 1, wherein the mounting holes are arranged at intervals, the wires are arranged in one-to-one correspondence with the mounting holes; and the snapping of the wires into the mounting holes from the notch comprises:

snapping the wires into the corresponding mounting holes from the notch.

13. The thermal runaway trigger method according to claim 1, further comprising:

covering the heating member by an insulating member, and then connecting the heating member covered by the insulating member to the electrode assembly.

14. The thermal runaway trigger method according to claim 1, wherein the heating member is a heating wire.

15. The thermal runaway trigger method according to claim 1, wherein the heating member comprises a material that produces an exothermic reaction after being connected with a component inside the battery cell.

* * * * *